(12) United States Patent  
Enatsu et al.

(10) Patent No.: US 12,476,108 B2  
(45) Date of Patent: Nov. 18, 2025

(54) GaN SUBSTRATE WAFER AND PRODUCTION METHOD FOR SAME

(71) Applicant: MITSUBISHI CHEMICAL CORPORATION, Tokyo (JP)

(72) Inventors: Yuuki Enatsu, Tokyo (JP); Kenji Iso, Tokyo (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 666 days.

(21) Appl. No.: 17/536,396

(22) Filed: Nov. 29, 2021

(65) Prior Publication Data

US 2022/0084820 A1 Mar. 17, 2022

Related U.S. Application Data

(63) Continuation of application No. PCT/JP2020/021133, filed on May 28, 2020.

(30) Foreign Application Priority Data

May 30, 2019 (JP) .................. 2019-101184  
Jun. 19, 2019 (JP) .................. 2019-113570

(51) Int. Cl.
   *H01L 21/02* (2006.01)
   *C30B 25/20* (2006.01)
   *H10D 62/85* (2025.01)

(52) U.S. Cl.
   CPC ........ *H01L 21/02389* (2013.01); *C30B 25/20* (2013.01); *H01L 21/02008* (2013.01);
   (Continued)

(58) Field of Classification Search
   None
   See application file for complete search history.

(56) References Cited

U.S. PATENT DOCUMENTS

| | | | |
|---|---|---|---|
| 2007/0096147 A1 | 5/2007 | Oshima | |
| 2007/0141823 A1 | 6/2007 | Preble et al. | |
| 2007/0145376 A1* | 6/2007 | Okui | H01L 21/0254 |
| | | | 257/E21.108 |

(Continued)

FOREIGN PATENT DOCUMENTS

| CN | 101194053 A | 6/2008 |
|---|---|---|
| CN | 105917035 A | 8/2016 |

(Continued)

OTHER PUBLICATIONS

Translation—JP-6437736-B2; Fujiyama Y; Dec. 12, 2018 (Year: 2018).*

(Continued)

*Primary Examiner* — Humera N. Sheikh
(74) *Attorney, Agent, or Firm* — Element IP, PLC

(57) ABSTRACT

Provided is a GaN substrate wafer with an improved productivity, which can be preferably used in the production of a nitride semiconductor device having a horizontal device structure. The GaN substrate wafer is a (0001)-oriented GaN substrate wafer that includes a first region arranged on an N-polar side and a second region, which is arranged on a Ga-polar side and has a minimum thickness, via a regrowth interface therebetween. In this GaN substrate wafer, the second region has a minimum thickness of not less than 20 μm, and at least a portion of the second region has a total compensating impurity concentration of $1 \times 10^{17}$ atoms/cm$^3$ or higher.

24 Claims, 8 Drawing Sheets

(52) U.S. Cl.
CPC .. *H01L 21/02433* (2013.01); *H01L 21/02458* (2013.01); *H01L 21/0254* (2013.01); *H10D 62/8503* (2025.01)

(56) References Cited

U.S. PATENT DOCUMENTS

| | | | |
|---|---|---|---|
| 2009/0032907 A1 | 2/2009 | Uemura et al. | |
| 2016/0319460 A1 | 11/2016 | Tsukada et al. | |
| 2016/0348272 A1* | 12/2016 | Hayashi | C30B 29/406 |
| 2017/0009378 A1 | 1/2017 | Shibata et al. | |
| 2019/0326111 A1* | 10/2019 | Fujikura | C30B 25/02 |

FOREIGN PATENT DOCUMENTS

| | | | | |
|---|---|---|---|---|
| JP | 2009269816 A | | 11/2009 | |
| JP | 2012232884 A | | 11/2012 | |
| JP | 2013197357 A | | 9/2013 | |
| JP | 2014118323 A | | 6/2014 | |
| JP | 2016533028 A | | 10/2016 | |
| JP | 2017019709 A | | 1/2017 | |
| JP | 2018070405 A | | 5/2018 | |
| JP | 6437736 B2 | * | 12/2018 | |
| KR | 1020170100629 A | | 9/2017 | |
| KR | 1020190036538 A | | 4/2019 | |
| TW | 200720497 A | | 6/2007 | |
| WO | WO-2007023722 A1 | | 3/2007 | |
| WO | WO-2015114732 A1 | | 8/2015 | |
| WO | WO-2018078962 A1 | * | 5/2018 | C23C 16/34 |
| WO | WO-2018230150 A1 | | 12/2018 | |

OTHER PUBLICATIONS

Extended European Search Report issued Jun. 28, 2022 in European Patent Application No. 20814497.2.

Grzegory et al., "Growth of GaN:Mg crystals by high nitrogen pressure solution method in multi-feed-seed configuration", Journal of Crystal Growth, vol. 350, 2012, pp. 50-55, Available Online: Dec. 13, 2011.

Lee et al., "GaN, AlN, InN and Related Materials", Materials Research Society Symposium Proceedings, vol. 892, 2005, pp. 729-733.

English translation of the International Preliminary Report on Patentability and Written Opinion issued Dec. 9, 2021 in PCT/JP2020/021133, 6 pages.

International Search Report issued Aug. 11, 2020 in PCT/JP2020/021133, 2 pages.

Combined Chinese Office Action and Search Report issued Jul. 12, 2023 in corresponding Chinese Patent Application No. 202080040339.8 (with English machine translation), 28 pages.

Office Action issued Mar. 1, 2024 in corresponding Chinese Patent Application No. 202080040339.8 (with machine English translation), 26 pages.

Combined Taiwanese Office Action and Search Report issued Aug. 1, 2024, in corresponding Taiwanese Patent Application No. 109117753 (with English translation), 20 pages.

Final Rejection issued May 15, 2024 in corresponding Chinese Patent Application No. 202080040339.8, (with machine English translation), 31 pages.

Office Action issued Jun. 4, 2024 in corresponding Japanese Patent Application No. 2021-522864, (with English machine translation), 8 pages.

Office Action issued May 27, 2024 in corresponding Korean Patent Application No. 10-2021-7039707, (with machine English translation), 36 pages.

Final Office Action issued Feb. 20, 2025, in corresponding Korean Patent Application No. 10-2021-7039707 (with machine English translation), 8 pages.

* cited by examiner

GaN SUBSTRATE WAFER AND PRODUCTION METHOD FOR SAME

CROSS-REFERENCE TO RELATED APPLICATION

This is a continuation of International Application PCT/JP2020/021133, filed on May 28, 2020, and designated the U.S., and claims priority from Japanese Patent Application 2019-101184 which was filed on May 30, 2019, and Japanese Patent Application 2019-113570 which was filed on Jun. 19, 2019, the entire contents of which are incorporated herein by reference.

TECHNICAL FIELD

The present invention relates to a substrate wafer containing GaN (gallium nitride), and a method of producing the same. The term "substrate wafer" used herein means a wafer that is used as a substrate in the production of a semiconductor device.

BACKGROUND ART

There has been proposed a GaN substrate wafer having a high resistance region partially formed only on the front surface side, which GaN substrate wafer is obtained by a method in which a thick GaN film provided with a region having a high concentration of transition metal atoms only on an upper part is grown on a sapphire wafer by hydride vapor phase epitaxy (HVPE) and the thick GaN film is subsequently peeled off from the sapphire wafer (Patent Document 1). In Patent Document 1, it is described that a GaN substrate wafer produced by this method is hardly cracked, although a GaN crystal having a resistance increased by impurity doping is easily cracked.

RELATED ART DOCUMENT

Patent Document

Patent Document 1: Japanese Unexamined Patent Application Publication No. 2012-232884

SUMMARY OF THE INVENTION

Problems to be Solved by the Invention

In the production of a GaN substrate wafer in which a region with an improved specific resistance is arranged partially on only the front surface side by the method disclosed in Patent Document 1, it is necessary to grow a thick GaN film on a single sapphire wafer by HVPE for every single GaN substrate wafer to be produced.

Means for Solving the Problems

The present inventors realized that a GaN substrate wafer having a region with an improved specific resistance partially on only the front surface side can be produced more efficiently by preparing a GaN wafer having a low impurity concentration in advance and subsequently growing thereon a GaN layer doped with compensating impurities, instead of employing the method disclosed in Patent Document 1.

The present invention was made based on this idea, and embodiments of the present invention include the followings.

[1] A (0001)-oriented GaN substrate wafer, including a first region arranged on an N-polar side and a second region, which is arranged on a Ga-polar side and has a minimum thickness, via a regrowth interface therebetween,
wherein
the minimum thickness of the second region is not less than 20 µm, and
at least a portion of the second region has a total compensating impurity concentration of $1\times10^{17}$ atoms/cm$^3$ or higher.

[2] The GaN substrate wafer according to [1], wherein the first region satisfies one or more conditions selected from the following (a) to (c):
(a) the Si concentration is $5\times10^{16}$ atoms/cm$^3$ or higher;
(b) the O concentration is $3\times10^{16}$ atoms/cm$^3$ or lower; and
(c) the H concentration is $1\times10^{17}$ atoms/cm$^3$ or lower.

[3] The GaN substrate wafer according to [1] or [2], wherein, in the first region, a total compensating impurity concentration is lower than a total donor impurity concentration.

[4] The GaN substrate wafer according to any one of [1] to [3], wherein, in the first region, the total compensating impurity concentration is lower than $1\times10^{17}$ atoms/cm$^3$.

[5] The GaN substrate wafer according to any one of [1] to [4], wherein, in the first region, the concentrations of impurity elements other than Si, O, and H are independently $5\times10^{15}$ atoms/cm$^3$ or lower.

[6] The GaN substrate wafer according to any one of [1] to [5], satisfying one condition selected from the following (1) to (3):
(1) having a diameter of 50 mm to 55 mm and a thickness of 250 µm to 450 µm;
(2) having a diameter of 100 mm to 105 mm and a thickness of 350 µm to 750 µm; and
(3) having a diameter of 150 mm to 155 mm and a thickness of 450 µm to 800 µm.

[7] The GaN substrate wafer according to any one of [1] to [6], wherein
the second region includes a main doped region including at least a main surface of the Ga-polar side, and
the main doped region has a total compensating impurity concentration of $1\times10^{17}$ atoms/cm$^3$ or higher.

[8] The GaN substrate wafer according to [7], wherein the total compensating impurity concentration in the main doped region is $1\times10^{18}$ atoms/cm$^3$ or higher.

[9] The GaN substrate wafer according to [7] or [8], wherein, in the main doped region, the total compensating impurity concentration is twice or more of a total donor impurity concentration.

[10] The GaN substrate wafer according to any one of [7] to [9], wherein the main doped region contains at least one element selected from carbon and transition metal elements.

[11] The GaN substrate wafer according to any one of [7] to [10], wherein an impurity contained in the main doped region at a highest concentration is Fe, Mn, or C.

[12] The GaN substrate wafer according to any one of [7] to [11], wherein
the main doped region is a region within a specific length from the main surface of a Ga-polar side, and
the specific length is not less than 20 µm.

[13] The GaN substrate wafer according to any one of [7] to [12], wherein, in the main doped region, a variation in the total compensating impurity concentration along a c-axis direction is in a range of ±25% from a median value.

[14] The GaN substrate wafer according to [12] or [13], wherein the specific length is greater than 50 µm.

[15] The GaN substrate wafer according to any one of [12] to [14], wherein the specific length is 50% or more of the minimum thickness of the second region.

[16] The GaN substrate wafer according to any one of [1] to [15], wherein the second region has a total compensating impurity concentration of $5\times10^{19}$ atoms/cm$^3$ or lower.

[17] The GaN substrate wafer according to any one of [1] to [16], wherein the minimum thickness of the second region is 300 µm or less.

[18] The GaN substrate wafer according to any one of [1] to [17], wherein the main surface of the Ga-polar side is a flat surface.

[19] The GaN substrate wafer according to [18], wherein the regrowth interface is inclined with respect to the main surface of the Ga-polar side.

[20] The GaN substrate wafer according to [19], wherein a difference in the thickness of the second region between one end and the other end in the inclination direction of the regrowth interface is not larger than 200 µm.

[21] An epitaxial wafer, including: the GaN substrate wafer according to any one of [1] to [20]; and a nitride semiconductor layer epitaxially grown on the main surface of the Ga-polar side of the GaN substrate wafer.

[22] A method of producing an epitaxial wafer, the method including the steps of:
preparing the GaN substrate wafer according to any one of [1] to [20]; and
growing a nitride semiconductor layer on the main surface of the Ga-polar side of the GaN substrate wafer.

[23] A method of producing a nitride semiconductor device, the method including the steps of:
preparing the GaN substrate wafer according to any one of [1] to [20];
growing a nitride semiconductor layer on the main surface of the Ga-polar side of the GaN substrate wafer to obtain an epitaxial wafer; and
removing the first region of the GaN substrate wafer from at least a portion of the epitaxial wafer.

[24] A method of producing a GaN substrate wafer, the method including:
the second step of obtaining a second c-plane GaN wafer by growing a (0001)-oriented second thick GaN film on a substrate by HVPE and subsequently slicing the second thick GaN film; and
the third step of growing a (0001)-oriented GaN film having a thickness of greater than 50 µm on the second c-plane GaN wafer by HVPE,
wherein the GaN film is provided with a portion having a total compensating impurity concentration of $1\times10^{17}$ atoms/cm$^3$ or higher.

[25] A method of producing a GaN substrate wafer that includes a region on an N-polar side and a region on a Ga-polar side via a regrowth interface therebetween, the method including:
(i) the first step of obtaining at least one first c-plane GaN wafer by growing a (0001)-oriented first thick GaN film, which is formed of GaN not intentionally doped, on a seed wafer by HVPE and processing the first thick GaN film;

(ii) the second step of growing a (0001)-oriented second thick GaN film, which is formed of GaN not intentionally doped, by HVPE on the first c-plane GaN wafer obtained in the first step, and slicing a second c-plane GaN wafer from the second thick GaN film; and (iii) the third step of obtaining a laminated structure by growing a (0001)-oriented GaN film having a thickness of greater than 50 µm by HVPE on the second c-plane GaN wafer obtained in the second step,
wherein the GaN film grown in the third step is provided with a portion having a total compensating impurity concentration of $1\times10^{17}$ atoms/cm$^3$ or higher.

[26] The method of producing a GaN substrate wafer according to [25], wherein the thickness of the GaN film is 300 µm or less.

[27] The method of producing a GaN substrate wafer according to [25] or [26], wherein the GaN substrate wafer satisfies one condition selected from the following (1) to (3):
(1) having a diameter of 50 mm to 55 mm and a thickness of 250 µm to 450 µm;
(2) having a diameter of 100 mm to 105 mm and a thickness of 350 µm to 750 µm; and
(3) having a diameter of 150 mm to 155 mm and a thickness of 450 µm to 800 µm.

[28] The method of producing a GaN substrate wafer according to any one of [25] to [27], wherein the GaN film includes a specific doped region which has a length of not less than 20 µm in a c-axis direction, and in which a total compensating impurity concentration is $1\times10^{17}$ atoms/cm$^3$ or higher.

[29] The method of producing a GaN substrate wafer according to [28], wherein the total compensating impurity concentration in the specific doped region is $1\times10^{18}$ atoms/cm$^3$ or higher.

[30] The method of producing a GaN substrate wafer according to [28] or [29], wherein, in the specific doped region, the total compensating impurity concentration is twice or more of a total donor impurity concentration.

[31] The method of producing a GaN substrate wafer according to any one of [28] to [30], wherein, in the specific doped region, a variation in the total compensating impurity concentration along the c-axis direction is in a range of ±25% from a median value.

[32] The method of producing a GaN substrate wafer according to any one of [28] to [31], wherein the length of the region is 50% or more of the thickness of the GaN film.

[33] The method of producing a GaN substrate wafer according to any one of [28] to [32], wherein the length from a lower end of the specific doped region to an interface of the GaN film and the second c-plane GaN wafer is 1 µm or greater.

[34] The method of producing a GaN substrate wafer according to any one of [28] to [33], wherein the specific doped region contains at least one element selected from carbon and transition metal elements.

[35] The method of producing a GaN substrate wafer according to any one of [28] to [34], wherein an impurity contained in the specific doped region at a highest concentration is Fe, Mn, or C.

[36] The method of producing a GaN substrate wafer according to any one of [24] to [35], wherein the total compensating impurity concentration in the GaN film is $5\times10^{19}$ atoms/cm$^3$ or lower.

[37] The method of producing a GaN substrate wafer according to any one of [24] to [36], further including the thinning step of thinning the laminated structure after the third step.

[38] The method of producing a GaN substrate wafer according to [37], wherein the GaN film has a thickness difference of 50 μm or greater before and after the thinning step.

[39] The method of producing a GaN substrate wafer according to [37] or [38], wherein the GaN film has a thickness difference of 200 μm or less before and after the thinning step.

[40] The method of producing a GaN substrate wafer according to any one of [37] to [39], wherein the GaN substrate wafer has an off-cut orientation different from that of the second c-plane GaN wafer.

[41] The method of producing a GaN substrate wafer according to any one of [24] to [40], further including, before growing the GaN film in the third step:

the planarization step of planarizing a main surface of a Ga-polar side of the second c-plane GaN wafer sliced from the second GaN film in the second step; and the roughening step of roughening the main surface by etching.

Effects of the Invention

A GaN substrate wafer having an improved productivity, which can be preferably used in the production of a nitride semiconductor device having a horizontal device structure, and a method of producing the same are provided.

MODE FOR CARRYING OUT THE INVENTION

Embodiments of the present invention will now be described in detail. The following descriptions of requirements are merely examples (representative examples) of the embodiments of the present invention, and the present invention is not limited to the contents thereof within the gist of the present invention.

Unless otherwise specified, the expression "X to Y" (wherein, X and Y are arbitrary numbers) used herein encompasses not only the meaning of "X or more but Y or less", but also the meaning of "preferably larger than X" and "preferably smaller than Y".

Further, in the present specification, the term "independently" used for describing two or more subjects together means that the two or more subjects may be the same or different from each other.

1. GaN Substrate Wafer

One embodiment of the present invention relates to a GaN substrate wafer.

The GaN substrate wafer according to one embodiment is a (0001)-oriented GaN substrate wafer including a first region arranged on an N-polar side and a second region, which is arranged on a Ga-polar side and has a minimum thickness, via a regrowth interface therebetween. The minimum thickness of the second region is not less than 20 μm, and at least a portion of the second region has a total compensating impurity concentration of $1 \times 10^{17}$ atoms/cm$^3$ or higher.

Further, regarding the impurity concentrations in the first region, it is preferable that the above-described GaN substrate wafer satisfies one or more conditions selected from the following (a) to (c):

(a) the Si (silicon) concentration is $5 \times 10^{16}$ atoms/cm$^3$ or higher;

(b) the O (oxygen) concentration is $3 \times 10^{16}$ atoms/cm$^3$ or lower; and (c) the H (hydrogen) concentration is $1 \times 10^{17}$ atoms/cm$^3$ or lower.

It is noted here that the term "impurity" used herein means a component other than Ga element and N element that are contained in a GaN substrate.

The term "(0001)-oriented GaN wafer" used herein refers to a GaN wafer having main surfaces (large-area surfaces) parallel to or substantially parallel to the (0001) crystal plane, namely the c-plane, and is also called "c-plane GaN wafer".

Figure 1:
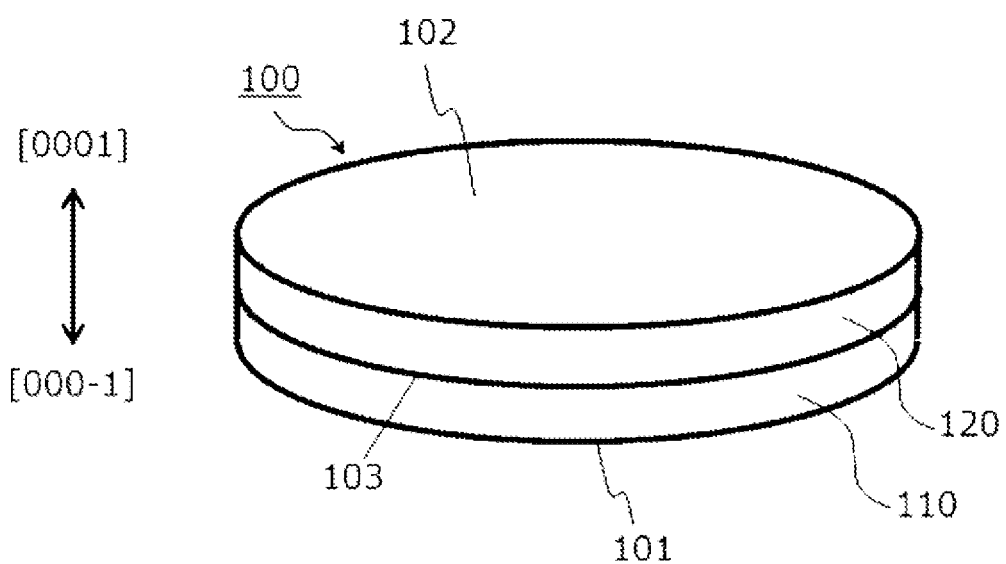
FIG. 1 is a perspective view illustrating a GaN substrate wafer according to one embodiment.
Figure 2:
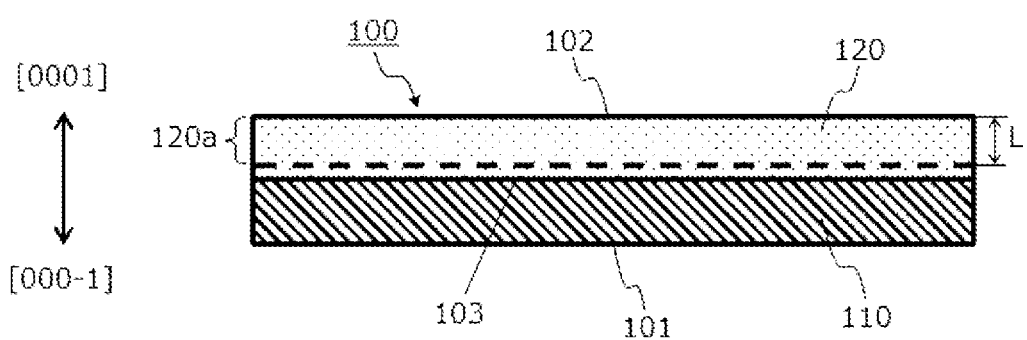
FIG. 2 is a cross-sectional view illustrating the GaN substrate wafer according to one embodiment.

FIGS. 1 and 2 illustrate an example of a GaN substrate wafer according to one embodiment. FIG. 1 is a perspective view, and FIG. 2 is a cross-sectional view.

A GaN substrate wafer 100 illustrated in FIGS. 1 and 2 is a self-supporting substrate wafer consisting of only a GaN crystal, and one of its two main surfaces is an N-polar surface 101, while the other is a Ga-polar surface 102. The N-polar surface 101 and the Ga-polar surface 102 are parallel to each other.

The GaN substrate wafer 100 is (0001)-oriented, and an inclination of the Ga-polar surface 102 with respect to the (0001) crystal plane is 10° or smaller, preferably 5° or smaller, more preferably 2.5° or smaller. The inclination may be, for example, 0.2° to smaller than 1°, or 1° to 2.5°.

The GaN substrate wafer 100 has a diameter of usually 45 mm or larger, and may be 95 mm or larger, or 145 mm or larger. The diameter is typically, for example, 50 to 55 mm (about 2 inches), 100 to 105 mm (about 4 inches), or 150 to 155 mm (about 6 inches).

A preferred range of the thickness of the GaN substrate wafer 100 varies depending on the diameter. When the diameter is about 2 inches, the thickness is preferably 250 μm or greater, more preferably 300 μm or greater, but preferably 450 μm or less, more preferably 400 μm or less. When the diameter is about 4 inches, the thickness is preferably 350 μm or greater, more preferably 400 μm or greater, but preferably 750 μm or less, more preferably 650 μm or less. When the diameter is about 6 inches, the thickness is preferably 450 µm or greater, more preferably 550 µm or greater, but preferably 800 µm or less, more preferably 700 µm or less.

As described above, the GaN substrate wafer 100 usually has a disk shape; however, in a modification example, the main surfaces may have a square shape, a rectangular shape, a hexagonal shape, an octagonal shape, an elliptical shape or the like, or may have an amorphous shape. In such a modification example, the above-described "diameter" is interchangeable with "shortest straight line passing through the center of gravity of a main surface".

The N-polar surface 101 of the GaN substrate wafer 100 is a "back surface", and may be a mirror-finished surface, a roughened surface, or a mat-finished surface.

The Ga-polar surface 102 of the GaN substrate wafer 100 is a "front surface" and, when the GaN substrate wafer 100 is used in the production of a nitride semiconductor device, a nitride semiconductor layer is usually epitaxially grown on the Ga-polar surface 102.

The Ga-polar surface 102 may be a surface of a grown crystal as is (as-grown); however, it is usually processed and thereby planarized. The processing performed for planarizing the Ga-polar surface 102 into a flat surface may include at least one selected from grinding and chemical mechanical polishing (CMP). In addition to these processes, etching may be performed for the purpose of removing a damaged layer. The roughness of the flat surface is not restricted; however, for example, the root-mean-square (RMS) roughness of the Ga-polar surface 102, which is measured under an atomic force microscope (AFM), is preferably less than 5 nm, more preferably less than 2 nm, still more preferably less than 1 nm, and may be less than 0.5 nm, in a measurement area of 2 µm×2 µm.

The Ga-polar surface 102 may be a surface formed by cutting; however, it is preferably a surface that has been subjected to only planarization by grinding, CMP, etching or the like without cutting.

The GaN substrate wafer 100 has a regrowth interface 103 between the two main surfaces, and has a first region 110 on the N-polar side and a second region 120 on the Ga-polar side via the regrowth interface 103 therebetween. The term "regrowth interface" used herein means an interface that is generated when a GaN crystal is grown on an arbitrary substrate, and the presence thereof can be confirmed by, for example, cathodoluminescence imaging of a cross-section of the GaN substrate wafer under a scanning electron microscope, or observation of a cross-section under a fluorescent microscope.

The regrowth interface 103 is preferably parallel to the Ga-polar surface 102. When the regrowth interface 103 is inclined from the Ga-polar surface 102, the second region 120 usually has a minimum thickness at one end of the inclined direction and a maximum thickness at the other end. A difference in the thickness of the second region 120 between the one end and the other end is preferably not larger than 200 µm.

In a production process of a nitride semiconductor device using the GaN substrate wafer 100, it is expected that the first region 110 be removed eventually. In other words, a nitride semiconductor device chip produced using the GaN substrate wafer 100 is expected not to contain any part originating from the first region 110. In this mode of use, there is no particular restriction in terms of the electrical characteristics of the GaN crystal constituting the first region 110.

The first region 110 is usually formed of a GaN crystal grown by HVPE and, therefore, satisfies one or more conditions selected from the following (a) to (c) regarding the impurity concentrations:
(a) the Si concentration is $5 \times 10^{16}$ atoms/cm$^3$ or higher;
(b) the O concentration is $3 \times 10^{16}$ atoms/cm$^3$ or lower; and
(c) the H concentration is $1 \times 10^{17}$ atoms/cm$^3$ or lower.

In the present specification, "HVPE" means hydride vapor phase epitaxy.

In a GaN crystal grown by HVPE, unless intentional doping thereof with compensating impurities is performed, a total compensating impurity concentration is normally lower than lower than a total donor impurity concentration. It is noted here that the term "intentional doping" used herein means an addition of an element of interest as a raw material in a process of growing a GaN crystal.

Further, in the first region, the total compensating impurity concentration is preferably lower than $1 \times 10^{17}$ atoms/cm$^3$.

The GaN crystal constituting the first region 110 is preferably a GaN crystal that is not intentionally doped.

The second region 120 is grown on the first region 110 by HVPE. The reason why the regrowth interface 103 exists between the first region 110 and the second region 120 is because the step of growing the first region 110 and the step of growing the second region 120 are not continuous.

The second region 120 has a minimum thickness of not less than 20 µm. The reason for this is to allow, in a production process of a nitride semiconductor device chip using the GaN substrate wafer 100, the second region 120 remaining after the removal of the first region 110 from the substrate wafer 100 to play a role as a substrate that supports the structure of the semiconductor device chip. The term "minimum thickness" used herein means a thickness at a spot where the thickness is the smallest.

The minimum thickness of the second region 120 may be, for example, 50 µm or greater, greater than 50 µm, 75 µm or greater, 100 µm or greater, or even 150 µm or greater.

The minimum thickness of the second region 120 is preferably 350 µm or less, more preferably 300 µm or less, and may be, for example, 250 µm or less, 200 µm or less.

When the Ga-polar surface 102 and the regrowth interface 103 are parallel to each other and the second region 120 has a uniform thickness, the second region is deemed to have a minimum thickness at all spots.

Preferably, in the second region 120, a region including at least the main surface of the Ga-polar side, specifically a region within a specific length L from the Ga-polar surface 102 of the GaN substrate wafer 100, is defined as "main doped region 120a". The second region 120 is doped such that at least the main doped region 120a has a total compensating impurity concentration of $1 \times 10^{17}$ atoms/cm$^3$ or higher.

The term "total compensating impurity concentration" used herein refers to a sum of the concentrations of all types of compensating impurities. In a GaN crystal grown by HYPE, unless it is intentionally doped, the total compensating impurity concentration is normally lower than $1 \times 10^{17}$ atoms/cm$^3$. Accordingly, the total compensating impurity concentration can be increased to $1 \times 10^{17}$ atoms/cm$^3$ or higher by intentional doping.

The term "compensating impurities" used herein means impurities that have a function of compensating an n-type carrier in a GaN crystal, and C (carbon) and transition metal elements are well known as compensating impurities. The transition metal elements are typified by Fe (iron) and Mn (manganese) and, for example, Co (cobalt), Cr (chromium), V (vanadium), Ni (nickel), and Cu (copper) are also known.

The total compensating impurity concentration in the main doped region 120a may be, for example, $1 \times 10^{17}$ atoms/cm$^3$ or higher but lower than $2 \times 10^{17}$ atoms/cm$^3$, $2 \times 10^{17}$ atoms/cm$^3$ or higher but lower than $5 \times 10^{17}$ atoms/cm$^3$, $5 \times 10^{17}$ atoms/cm$^3$ or higher but lower than $1 \times 10^{18}$ atoms/cm$^3$, $1 \times 10^{18}$ atoms/cm$^3$ or higher but lower than $2 \times 10^{18}$ atoms/cm$^3$, $2 \times 10^{18}$ atoms/cm$^3$ or higher but lower than $5 \times 10^{18}$ atoms/cm$^3$, $5 \times 10^{18}$ atoms/cm$^3$ or higher but lower than $1 \times 10^{19}$ atoms/cm$^3$, $1 \times 10^{19}$ atoms/cm$^3$ or higher but lower than $2 \times 10^{19}$ atoms/cm$^3$, or $2 \times 10^{19}$ atoms/cm$^3$ or higher but lower than $5 \times 10^{19}$ atoms/cm$^3$.

In the main doped region 120a, the total compensating impurity concentration is preferably twice or more, more preferably 5 times or more, still more preferably 10 times or more of the total donor impurity concentration, and it may be 50 times or more of the total donor impurity concentration. Further, a compensating impurity contained in the main doped region 120a at the highest concentration is preferably Fe, Mn, or C.

In a preferred example, the concentrations of compensating impurities added to the main doped region 120a are set such that the GaN crystal constituting the main doped region 120a is semi-insulating, i.e. the GaN crystal has a room-temperature resistivity of $1 \times 10^3$ Ω·cm or higher.

Elements that can function as donor impurities in a GaN crystal include Group 14 elements, such as Si, Ge (germanium) and Sn (tin), and Group 16 elements, such as O, S (sulfur), Se (selenium) and Te (tellurium). Among these elements, Si and O can be contained in a GaN crystal grown by HVPE at a concentration in the order of $10^{16}$ atoms/cm$^3$ or higher even if they are not intentionally added. In contrast, Group 14 elements other than Si and Group 16 elements other than 0 are never contained in a GaN crystal grown by HVPE at a concentration in the order of $10^{13}$ atoms/cm$^3$ or higher unless they are intentionally added.

The specific length L is at least 1 μm, preferably 20 μm or greater, more preferably 25 μm or greater, still more preferably 50 μm or greater, and may be set arbitrarily within a range that does not exceed the minimum thickness of the second region 120.

In the main doped region 120a, a variation in the specific resistance along the c-axis direction, which is the thickness direction of the GaN substrate wafer 100, is desirably small. Accordingly, a variation in the total compensating impurity concentration along the c-axis direction in the main doped region 120a is preferably within ±25%, more preferably within ±20%, still more preferably within ±15%, yet still more preferably within ±10%, from a median value.

In a preferred embodiment, the specific length L is set to be greater than 50 μm such that, even when the second region 120 is partially removed from the GaN substrate wafer 100 in addition to the first region 110 and the main doped region 120a is thereby exposed in a production process of a semiconductor device chip using the GaN substrate wafer 100, the GaN substrate consisting of only the remaining main doped region 120a can support the structure of the resulting semiconductor device chip.

In this preferred embodiment, the specific length L may be 75 μm or greater, 100 μm or greater, 150 μm or greater, or 200 μm or greater.

In this preferred embodiment, the specific length L is preferably not less than 50%, more preferably not less than 75%, still more preferably not less than 90% of the minimum thickness of the second region 120.

Further, the length from a lower end (end on the side of the N-polar surface 101) of the specific length L to the regrowth interface is preferably 1 μm or greater, more preferably 5 μm or greater, or 10 μm or greater, but preferably 50 μm or less, more preferably 30 μm or less.

In order to avoid marked deterioration of the crystal quality caused by excessive doping, the total compensating impurity concentration in the second region 120 including the main doped region 120a can be controlled to be $5 \times 10^{19}$ atoms/cm$^3$ or lower, $2 \times 10^{19}$ atoms/cm$^3$ or lower, or $1 \times 10^{19}$ atoms/cm$^3$ or lower.

In the lowermost portion of the second region 120, namely the portion adjacent to the first region 110, the concentration of compensating impurities of the same kind as those intentionally added to the main doped region 120a may increase continuously or stepwise in the direction away from the first region 110.

The second region 120 is usually grown by HVPE and, therefore, satisfies one or more conditions selected from the following (a') to (c') regarding the impurity concentrations:

(a') the Si concentration is $5 \times 10^{16}$ atoms/cm$^3$ or higher;

(b') the O concentration is $3 \times 10^{16}$ atoms/cm$^3$ or lower; and (c') the H concentration is $1 \times 10^{17}$ atoms/cm$^3$ or lower.

Figure 3:
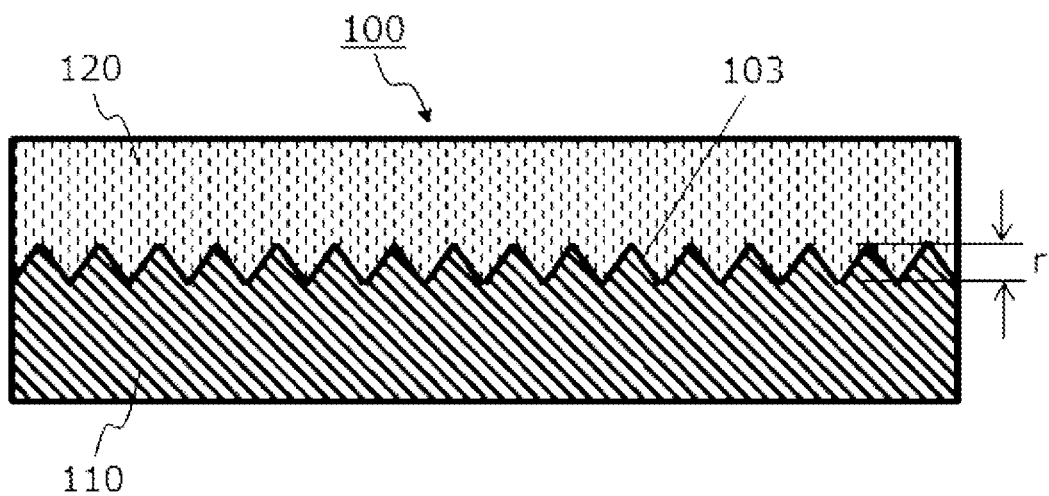
FIG. 3 is a cross-sectional view illustrating a GaN substrate wafer according to another embodiment.

In one example, as illustrated in FIG. 3, the regrowth interface 103 may be a rough surface. For example, when the surface of the first region 110 is roughened by etching before growing the second region 120, the regrowth interface 103 can be a rough surface. When a direction that is perpendicular to the regrowth interface 103 and extends from the first region 110 toward the second region 120 is defined as height direction and a difference in height between the highest point and the lowest point on the regrowth interface is defined as roughness (r) of the regrowth interface, the roughness (r) can be, for example, 0.3 μm to 12 μm.

In addition, the edges of the GaN substrate wafer 100 may be chamfered, although this is not illustrated in FIGS. 1 to 3. Further, as required, the GaN substrate wafer 100 may be provided with various markings, such as an orientation flat or notch that indicates the crystal orientation, and an index flat for making it easier to distinguish the front surface from the back surface.

The GaN substrate wafer 100 can be preferably used in the production of a nitride semiconductor device having a horizontal device structure, such as GaN-HEMI. The term "nitride semiconductor device" used herein refers to a semiconductor device in which a major portion of the device structure is constituted by a nitride semiconductor. A nitride semiconductor is also called "nitride-based Group III-V compound semiconductor", "Group III nitride-based compound semiconductor", "GaN-based semiconductor" or the like, and contains GaN along with a compound obtained by partially or entirely substituting gallium of GaN with other Periodic Table Group 13 element (e.g., B, Al, or In).

A horizontal device structure can be employed not only in electronic devices other than high electron mobility transistors (HEMTs) such as bipolar transistors, but also in light-emitting devices such as light-emitting diodes (LEDs) and laser diodes (LDs).

Figure 4:
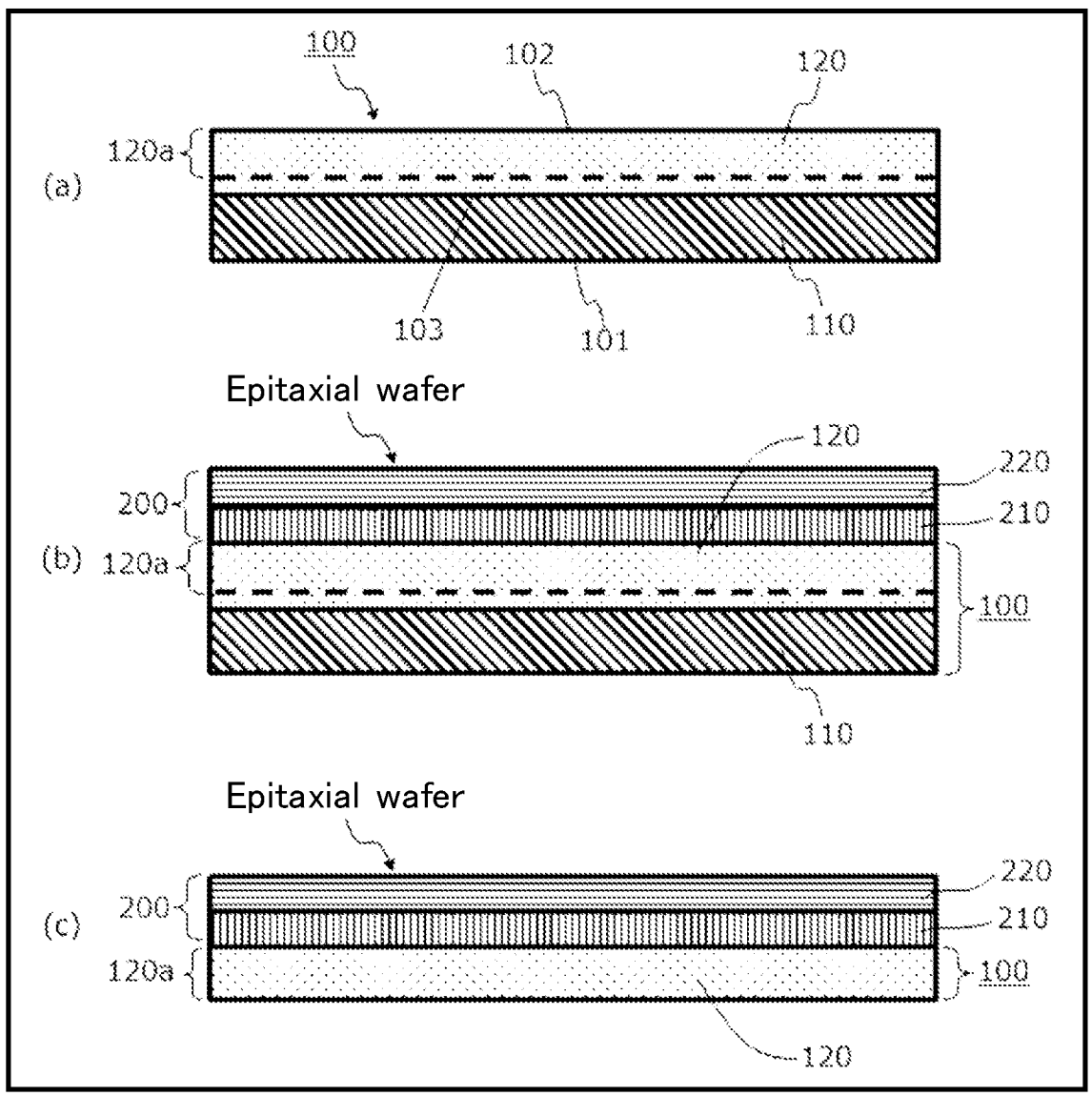
FIG. 4 is a process cross-sectional view for describing the steps of producing a nitride semiconductor device using a GaN substrate wafer according to one embodiment.

In the production of a GaN-HEMT using the GaN substrate wafer 100, the GaN substrate wafer 100 is prepared as illustrated in FIG. 4(a), and an epitaxial film 200 which includes at least an undoped GaN channel layer 210 and an undoped AlGaN carrier supply layer 220 is subsequently grown on the Ga-polar surface 102 by, for example, metalorganic vapor phase epitaxy (MOVPE) as illustrated in FIG. 4(b), whereby an epitaxial wafer is formed.

After the thus obtained epitaxial wafer is subjected to a semiconductor processing that may include etching, ion implantation, electrode formation, protective film formation and the like, the epitaxial wafer is divided into GaN-HEMI chips. Prior to this division, for thinning of the epitaxial wafer, at least a portion of the first region 110 of the GaN substrate wafer 100 is usually removed by grinding, etching or the like as illustrated in FIG. 4(c).

This thinning process may be performed such that a ring-form thick part remains on the outer periphery of the epitaxial wafer. In other words, the first region 110 of the GaN substrate wafer 100 may be removed only in those parts excluding the outer periphery of the epitaxial wafer.

In FIG. 4(c), the second region 120 is also partially removed from the GaN substrate wafer 100 such that the main doped region 120a is exposed on the N-polar surface side of the thus thinned epitaxial wafer. It is noted here that a semiconductor device using the GaN substrate wafer 100 is not limited only to a nitride semiconductor device.

2. Method of Producing GaN Substrate Wafer

Next, a method of producing a GaN substrate wafer, which is another embodiment of the present invention, will be described. The below-described production method is a preferred mode of producing the above-described GaN substrate wafer. Examples of a preferred mode of the GaN substrate wafer obtained by the below-described method of producing a GaN substrate wafer include the above-described GaN substrate wafer.

The above-described GaN substrate wafer 100 according to one embodiment can be preferably produced by the below-described method. This method is applied to the production of a GaN substrate wafer having an N-polar side region and a Ga-polar side region via a regrowth interface therebetween, preferably in which the specific resistance is improved at least partially on the Ga-polar side, and includes the following steps:

(ii') the second step of obtaining a second c-plane GaN wafer by growing a (0001)-oriented second thick GaN film on a substrate by HVPE and subsequently slicing the second thick GaN film; and (iii') the third step of growing a (0001)-oriented GaN film having a thickness of greater than 50 μm on the second c-plane GaN wafer by HVPE, on which GaN film a region having a higher total donor impurity concentration than the second c-plane GaN wafer is arranged.

The method preferably further includes the following first step added as the step of producing the substrate used in the second step. Accordingly, the following first step is optional.

(i) the first step of obtaining at least one first c-plane GaN wafer by growing a (0001)-oriented first thick GaN film, which is formed of GaN not intentionally doped, on a seed wafer by HVPE and processing the first thick GaN film;

(ii) the second step of growing a (0001)-oriented second thick GaN film, which is formed of GaN not intentionally doped, by HVPE on the first c-plane GaN wafer obtained in the first step, and slicing a second c-plane GaN wafer from the second thick GaN film; and (iii) the third step of obtaining a laminated structure by growing a (0001)-oriented GaN film having a thickness of greater than 50 μm by HVPE on the second c-plane GaN wafer obtained in the second step.

It is noted here that the GaN film is provided with a portion having a total compensating impurity concentration of $1\times10^{17}$ atoms/cm$^3$ or higher.

In the present specification, "on a wafer" is synonymous to "on the surface of a wafer".

The above-described first to third steps will now be described in detail. It is noted here that the structures and the properties of the above-described first and second regions can be applied to those of the first c-plane GaN wafer obtained in the first step and the second thick GaN film obtained in the second step, respectively.

Figure 5:
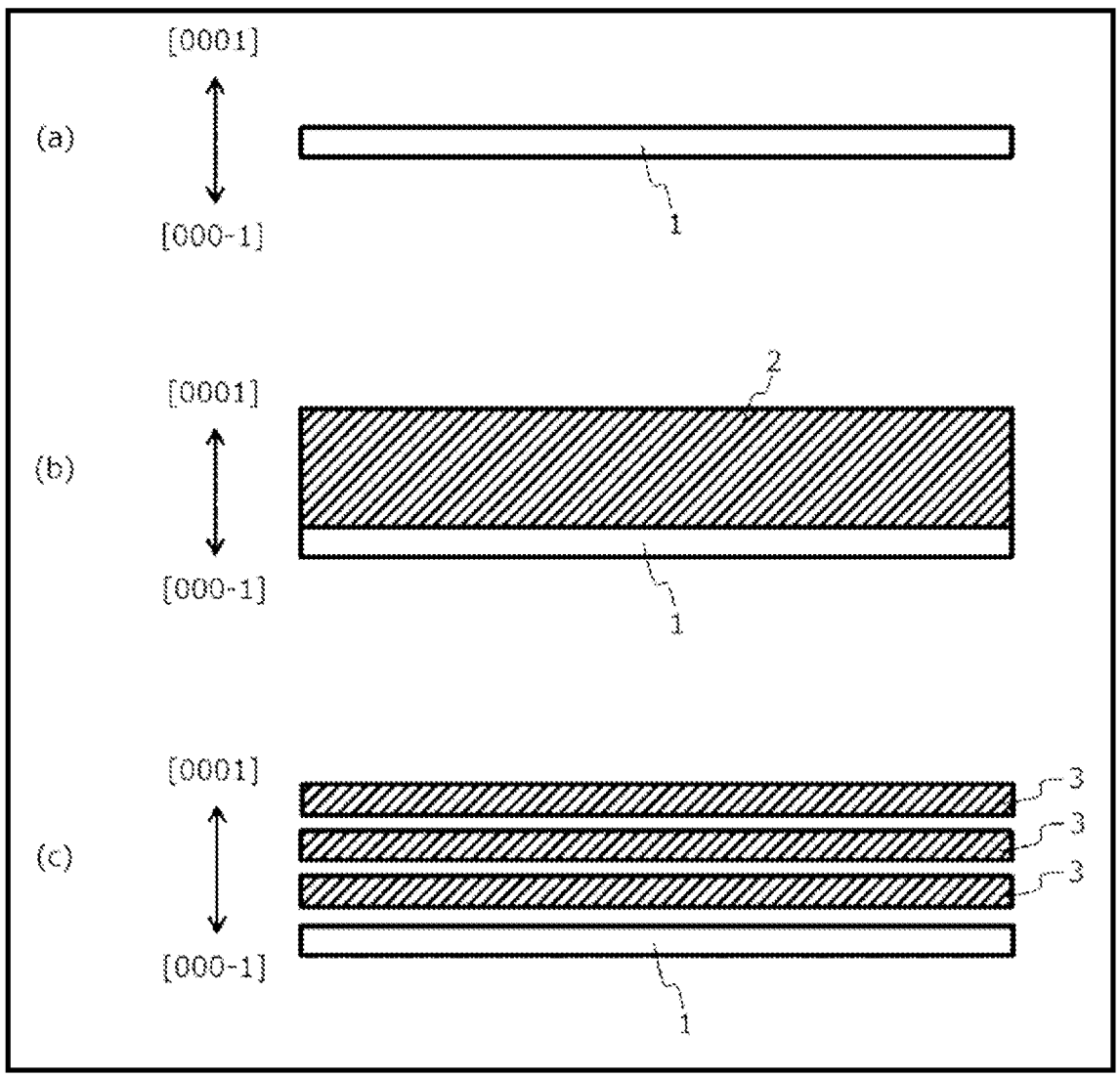
FIG. 5 is a process cross-sectional view for describing a method of producing a GaN substrate wafer according to one embodiment.

In the first step, a seed wafer 1 illustrated in FIG. 5(a) is prepared, and a (0001)-oriented first thick GaN film 2, which is formed of GaN not intentionally doped, is subsequently grown thereon by HVPE as illustrated in FIG. 5(b). Further, at least one first c-plane GaN wafer 3 is obtained by processing the first thick GaN film 2 as illustrated in FIG. 5(c).

One example of the seed wafer 1 is a c-plane sapphire wafer and, preferably, a peeling layer may be arranged on its main surface. A c-plane sapphire wafer having a peeling layer can be formed by, for example, growing a GaN layer of several hundred nanometers in thickness on a c-plane sapphire wafer by MOVPE via a low-temperature buffer layer, further forming a Ti (titanium) layer of several tens nanometers in thickness on the GaN layer by vacuum deposition, and subsequently annealing the resultant in a mixed gas of 80% H$_2$ (hydrogen gas) and 20% NH$_3$ (ammonia), for example, at 1,060° C. for 30 minutes.

The seed wafer 1 may also be a c-plane GaN wafer produced by a separate step.

The first thick GaN film 2 is grown to such a thickness that at least one self-supporting c-plane GaN wafer can be produced by processing the first thick GaN film 2. In a preferred example, the first thick GaN film 2 is grown to a thickness of several millimeters or greater, and at least two first c-plane GaN wafers 3 are sliced therefrom.

Figure 6:
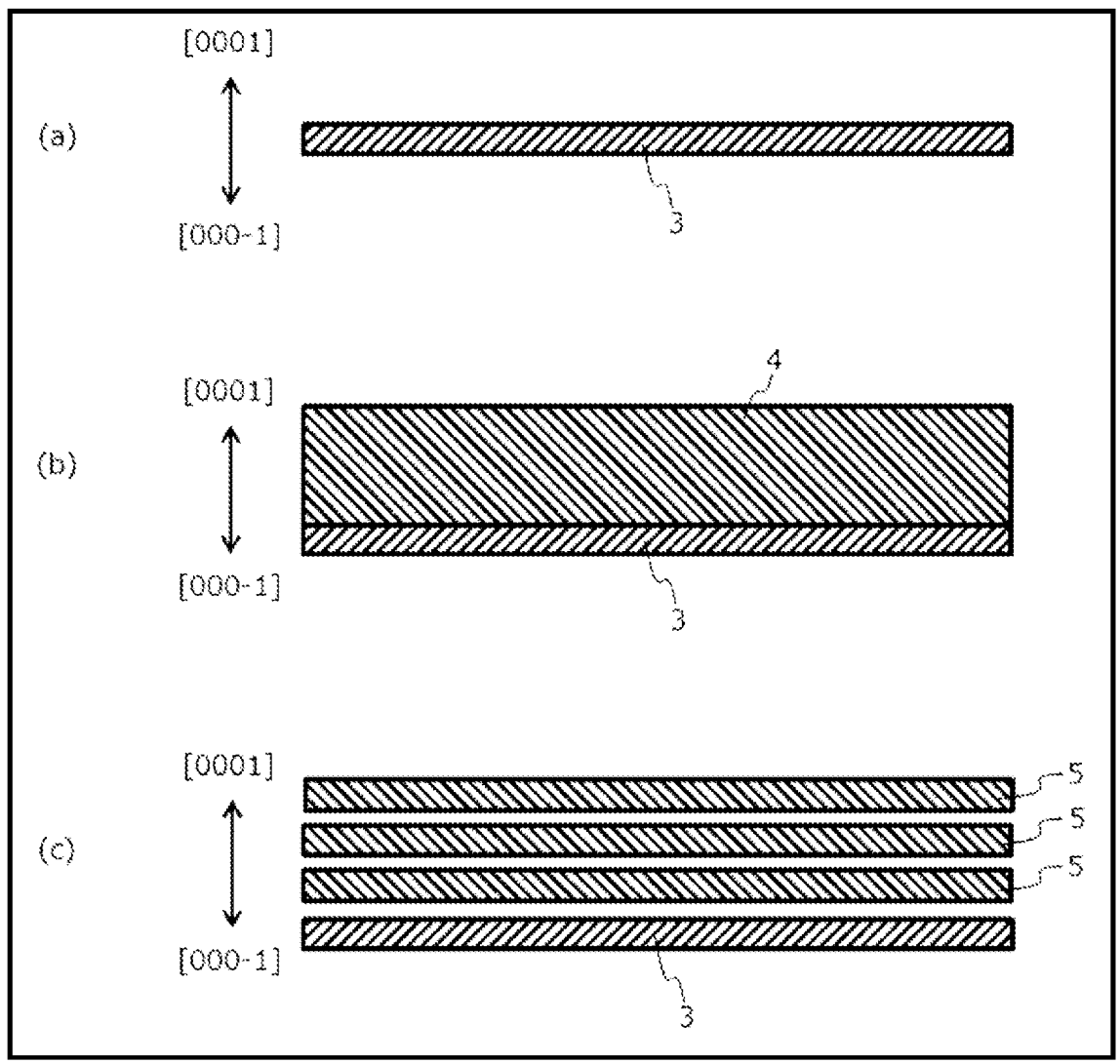
FIG. 6 is a process cross-sectional view for describing a method of producing a GaN substrate wafer according to another embodiment.

FIG. 6(a) is a cross-sectional view that illustrates a single first c-plane GaN wafer 3 produced in the first step. It is noted here, however, that the first c-plane GaN wafer 3 is not restricted to be one obtained by the first step.

In the second step, a (0001)-oriented second thick GaN film 4, which is formed of GaN not intentionally doped, is grown on the Ga-polar surface of the first c-plane GaN wafer 3 by HVPE as illustrated in FIG. 6(b), and second c-plane GaN wafers 5 are subsequently sliced from the second thick GaN film 4 as illustrated in FIG. 6(c). The second thick GaN film 4 is grown to such a thickness that at least one second c-plane GaN wafer 5 can be produced by processing the second thick GaN film 4. In a preferred example, the second thick GaN film 4 is grown to a thickness of several millimeters or greater, and at least two second c-plane GaN wafers 5 are sliced therefrom.

The second thick GaN film 4 has a weak n-type conductivity and thus can be sliced using a wire electrical discharge machining apparatus. A wire electrical discharge machining apparatus has a higher cutting rate and is easier to handle than a free abrasive grain-type wire saw. In addition, the amount of kerf loss caused by cutting the GaN crystal using a wire electrical discharge machining apparatus is smaller than the amount of kerf loss generated as a result of using a free abrasive grain-type wire saw.

Figure 7:
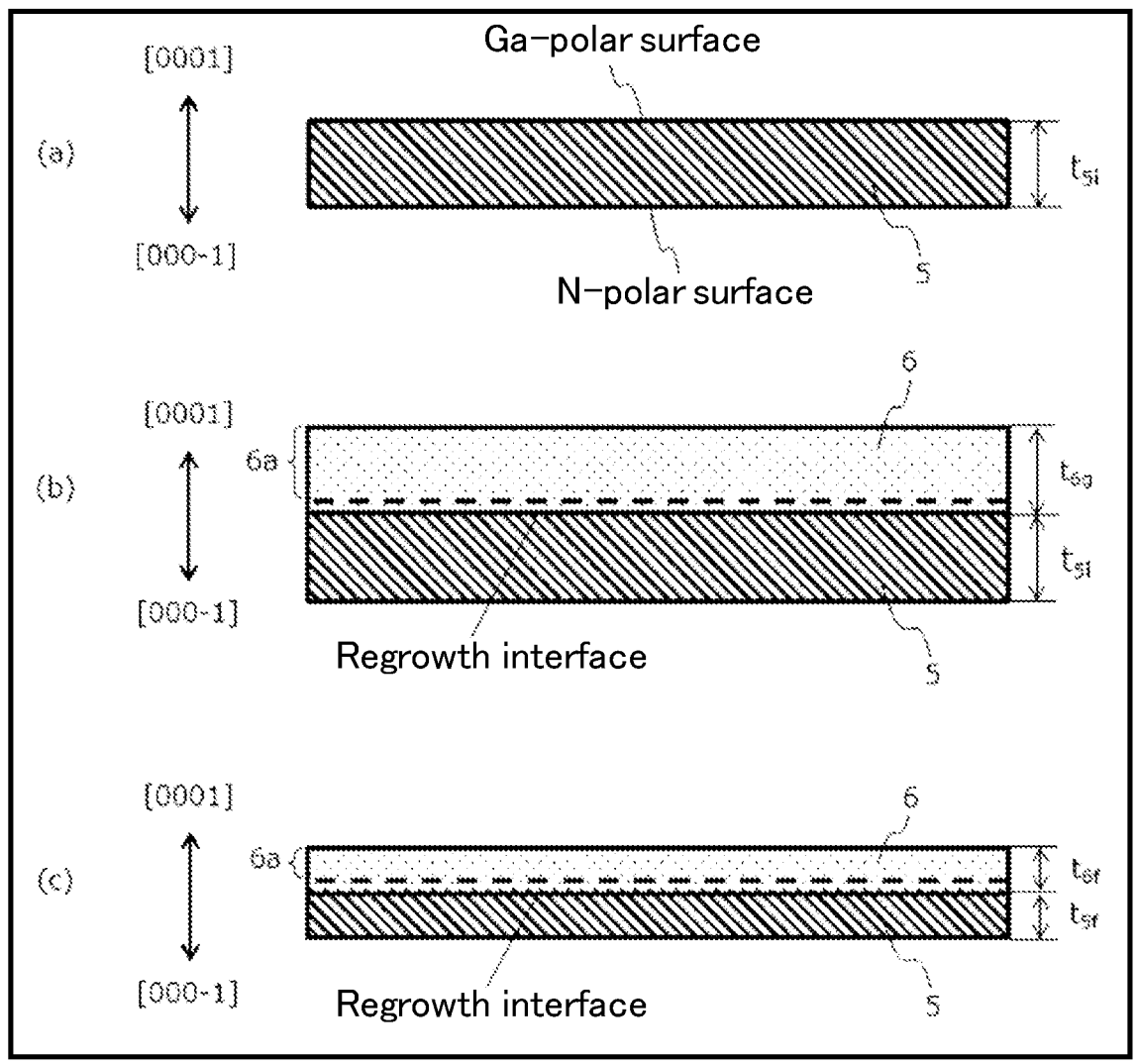
FIG. 7 is a process cross-sectional view for describing a method of producing a GaN substrate wafer according to yet another embodiment.

As illustrated in the cross-sectional view of FIG. 7(a), the second c-plane GaN wafer 5 has an N-polar surface and a Ga-polar surface, which are parallel to each other, as main surfaces.

In the production of the above-described GaN substrate wafer 100 according to one embodiment, at the time of slicing the second c-plane GaN wafer 5 from the second thick GaN film 4 in the second step, it is preferred, but not necessarily, that the inclination angle (cut-off angle) and the inclination direction (off-cut direction) of the Ga-polar surface with respect to the (0001) crystal plane in the second c-plane GaN wafer 5 be the same as the off-cut angle and the off-cut direction that the GaN substrate wafer 100 should have.

The off-cut orientation that the GaN substrate wafer 100 should have varies depending on the demand from a semiconductor device manufacturer using the GaN substrate wafer 100; however, preparation of the second c-plane GaN wafer 5 with various off-cut orientations can lead to a reduction in the production efficiency of the GaN substrate wafer 100. Attention must also be given to the point that the optimum conditions for the growth of a GaN film 6 on the second c-plane GaN wafer 5 by HVPE in the subsequent third step are variable depending on the cut-off orientation of the second c-plane GaN wafer 5.

An initial thickness $t_{si}$ of the second c-plane GaN wafer 5 may be less than the thickness that a GaN substrate wafer used in the production of a nitride semiconductor device usually has. This is because the second c-plane GaN wafer 5 only needs to not be broken before the subsequent third step, which is different from a GaN substrate wafer that is required to withstand a semiconductor processing that includes a large number of steps.

For example, when the second c-plane GaN wafer 5 has a diameter of about 2 inches, the initial thickness $t_{si}$ thereof is preferably 300 μm or less, and may be 250 μm or less, or 200 μm or less.

By reducing the initial thickness $t_{si}$ of the second c-plane GaN wafer 5, the number of second c-plane GaN wafers 5 that can be sliced from the second thick GaN film 4 can be increased.

In the third step, as illustrated in FIG. 7(b), a (0001)-oriented GaN film 6 having a growth thickness $t_{6g}$ of greater than 50 μm is grown on the Ga-polar surface of the second c-plane GaN wafer 5 by HVPE to obtain a laminated structure. In this process, a regrowth interface is formed between the second c-plane GaN wafer 5 and the GaN film 6.

Usually, the Ga-polar surface of the second c-plane GaN wafer 5 is processed to be flat by appropriately using a technique such as grinding, polishing, or CMP before growing the GaN film 6 thereon (planarization step). In one example, the GaN film 6 may be grown after processing the planarized Ga-polar surface to be a rough surface by etching (roughening step).

The use of HCl (hydrogen chloride) as an etching gas enables to roughen the Ga-polar surface of GaN without using an etching mask. By providing an HCl supply line for etching on an HVPE apparatus used for growing the GaN film 6, the Ga-polar surface of the second c-plane GaN wafer 5 can be roughened inside a reactor of the HVPE apparatus immediately before growing the GaN film 6.

Preferred etching conditions in the case of using HCl as an etching gas are as follows.

The HCl partial pressure is, for example, 0.002 to 0.05 atm.

The $H_2$ partial pressure is, for example, 0.2 to 0.8 atm.

The $NH_3$ partial pressure is, for example, 0.01 to 0.05 atm. By providing a $NH_3$ flow, the Ga-polar surface of GaN is roughened more uniformly.

The etching temperature is, for example, 900 to 1,050° C.

The etching time is, for example, 1 to 60 minutes. When the roughness of the Ga-polar surface of the second c-plane GaN wafer 5 after the etching is defined as a difference in height between the highest point and the lowest point, the roughness can be, for example, 0.3 μm to 12 μm.

In the etching with HCl, when the conditions other than the etching time are fixed, not only the etching time but also the roughness of the Ga-polar surface of the second c-plane GaN wafer tend to be increased.

When using HCl as an etching gas, the etching time may be set such that the roughness of the Ga-polar surface does not exceed 0.5 μm.

For example, when etching the Ga-polar surface of the second c-plane GaN wafer 5 under the conditions where the HCl partial pressure is 0.01 to 0.02 atm, the $H_2$ partial pressure is 0.05 to 0.08 atm, the $NH_3$ partial pressure is 0.01 to 0.03 atm, and the temperature is 970 to 1,000° C., the roughness of the Ga-polar surface can be controlled to be 0.5 μm or less by setting the etching time at 5 minutes or shorter.

In one example, a rough surface may be obtained by dry-etching the Ga-polar surface of the second c-plane GaN wafer 5 after forming thereon an etching mask patterned by a photolithography method. A dot pattern and a net pattern are typical examples of a preferred pattern of the etching mask. The dry-etching may be RIE (reactive ion etching) using $Cl_2$ (chlorine gas) or a chlorine-containing compound as an etching gas.

The GaN film 6 is doped such that at least a portion thereof has a total compensating impurity concentration of $1 \times 10^{17}$ atoms/cm$^3$ or higher. Compensating impurities that are particularly preferably used are Fe, Mn, and C.

In a preferred example, a specific doped region 6a may be arranged on the GaN film 6. The length of the specific doped region 6a in the c-axis direction is preferably 20 μm or greater, and the specific doped region 6a is a region having a total compensating impurity concentration of $1 \times 10^{17}$ atoms/cm$^3$ or higher. In other words, the length of this region means the thickness (height in the thickness direction) of a region having a total compensating impurity concentration of $1 \times 10^{17}$ atoms/cm$^3$ or higher.

The length of the specific doped region 6a in the c-axis direction may be, for example, 25 μm or greater, 50 μm or greater, 75 μm or greater, 100 μm or greater, 150 μm or greater, or 200 μm or greater.

An upper end (end on the [0001] side) of the specific doped region 6a may be positioned preferably within 10 μm, more preferably within 5 μm from the upper surface of the GaN film 6, or may constitute the upper surface of the GaN film 6.

The length from a lower end (end on the [000-1] side) of the specific doped region 6a to an interface of the second c-plane GaN wafer 5 and the GaN film 6 is preferably 1 μm or greater, more preferably 5 μm or greater, or 10 μm or greater, but preferably 50 μm or less, more preferably 30 μm or less.

The length of the specific doped region 6a in the c-axis direction is also preferably not less than 50%, more preferably not less than 75%, still more preferably not less than 90% of the thickness of the GaN film 6.

The total compensating impurity concentration in the specific doped region 6a is at least $1 \times 10^{17}$ atoms/cm$^3$, and may be, for example, $2 \times 10^{17}$ atoms/cm$^3$ or higher, $5 \times 10^{17}$ atoms/cm$^3$ or higher, $1 \times 10^{18}$ atoms/cm$^3$ or higher, $2 \times 10^{18}$ atoms/cm$^3$ or higher, or $5 \times 10^{18}$ atoms/cm$^3$ or higher.

The total compensating impurity concentration in the specific doped region 6a is preferably twice or more, more preferably 5 times or more, still more preferably 10 times or more of the total donor impurity concentration, and it may be 50 times or more of the total donor impurity concentration.

In the specific doped region 6a, the GaN crystal may be semi-insulating, i.e. the GaN crystal may have a room-temperature resistivity of $1 \times 10^3$ Ω·cm or higher.

In the specific doped region 6a, a variation in the specific resistance along the c-axis direction is desirably small. Accordingly, a variation in the total compensating impurity concentration along the c-axis direction in the specific doped region 6a is preferably within ±25%, more preferably within ±20%, still more preferably within ±15%, yet still more preferably within ±10%, from a median value.

In order to avoid marked deterioration of the crystal quality caused by excessive doping, the total compensating impurity concentration in the GaN film 6 including the specific doped region 6a can be controlled to be $5 \times 10^{19}$ atoms/cm$^3$ or lower, $2 \times 10^{19}$ atoms/cm$^3$ or lower, or $1 \times 10^{19}$ atoms/cm$^3$ or lower.

In a lowermost portion of the GaN film 6, namely a portion adjacent to the second c-plane GaN wafer 5, compensating impurities of the same kind as those added to the specific doped region 6a may be added such that the concentration thereof increases continuously or stepwise in the direction away from the second c-plane GaN wafer 5.

A growth thickness $t_{6g}$ of the GaN film 6 may be set in accordance with a design thickness of the region on the Ga-polar side of the GaN substrate wafer to be produced. Specifically, the growth thickness $t_{6g}$ may be, for example, 20 μm or greater, 50 μm or greater, greater than 50 μm, 75 μm or greater, 100 μm or greater, or 150 μm or greater, but 500 μm or less, 350 μm or less, 300 μm or less, 250 μm or less, or 200 μm or less.

In the production of the above-described GaN substrate wafer 100, the growth thickness $t_{6g}$ of the GaN film 6 may be the same as the design thickness of the second region 120 in the GaN substrate wafer; however, the growth thickness $t_{6g}$ is preferably greater than the design thickness, and this enables to planarize the surface of the GaN film 6 in the subsequent thinning step. Accordingly, in order to secure a machining allowance for the planarization, the growth thickness $t_{6g}$ of the GaN film 6 is greater than a maximum design thickness of the second region 120 by preferably at least 50 μm, more preferably at least 100 μm. A machining allowance of larger than 200 μm is normally not required. In other words, a difference in the thickness of the GaN film 6 before and after the thinning step is preferably 200 μm or smaller.

For example, when the growth thickness $t_{6g}$ of the GaN film 6 is greater than the maximum design thickness of the second region 120 by 50 μm or more, the thickness of the GaN film 6 is reduced by at least 50 μm in the subsequent thinning step. In other words, a difference in the thickness of the GaN film 6 before and after the thinning step is 50 μm or larger.

In the production of the above-described GaN substrate wafer 100, the growth thickness $t_{6g}$ of the GaN film 6 can be controlled to be 500 μm or less even in a wafer having a large diameter, for example, a wafer having a diameter of 6 inches.

Since the growth thickness $t_{6g}$ only needs to be small, the GaN film 6 can be formed in a relatively short time and, therefore, the GaN film 6 can be grown on a large number of second c-plane GaN wafers 5 at once without having to worry about clogging of an exhaust system of an HVPE apparatus caused by a byproduct NH$_4$Cl (ammonium chloride). Consequently, the through-put in the third step can be extremely high.

Moreover, the point that the formation of the GaN film 6 requires a short time can also contribute to a reduction in the cost associated with cleaning and maintenance of an HVPE reactor. Generally speaking, deterioration of an HVPE reactor is slower when the time required for a single growth step is short, and this leads to a longer service life.

After the third step, as required, the thinning step of thinning the laminated structure obtained in the third step is incorporated as illustrated in FIG. 7(c).

In FIG. 7(c), not only the thickness of the second c-plane GaN wafer 5 is reduced from the initial thickness $t_{5i}$ to a final thickness $t_{5f}$, but also the thickness of the GaN film 6 is reduced from the initial thickness $t_{6i}$ to a final thickness $t_{6f}$; however, in the thinning step, only either one of the second c-plane GaN wafer 5 and the GaN film 6 may be processed.

In the production of the above-described GaN substrate wafer 100 according to one embodiment, the thickness of the second c-plane GaN wafer 5 and that of the GaN film 6 are reduced in the thinning step until they match the design thickness of the first region 110 and that of the second region 120 in the resulting GaN substrate wafer, respectively.

When the off-cut orientation of the GaN substrate wafer 100 to be produced is the same as that of the second c-plane GaN wafer 5, the back surface of the second c-plane GaN wafer 5 (the N-polar surface of the laminated structure) can be used as a reference of the plane orientation during the thinning.

When the off-cut orientation of the GaN substrate wafer 100 to be produced is different from that of the second c-plane GaN wafer 5, i.e. when at least either the off-cut angle or the off-cut direction is different, the crystal orientation of the laminated structure is verified using an X-ray diffractometer prior to the thinning.

A processing method employed in the thinning step can be selected as appropriate from grinding, wrapping, CMP, dry etching, wet etching, and the like.

By employing the above-described production method, the GaN substrate wafer 100 according to one embodiment can be produced with a high yield.

The reason for this is because the production method includes neither the step of growing an intentionally doped thick GaN film by HVPE to a thickness of 1 mm or greater, nor the step of slicing a thick GaN film grown in such a manner.

In the first step and the second step, thick GaN films may be grown by HVPE to a thickness in the order of millimeters; however, the first thick GaN film 2 and the second thick GaN film 4 that are grown in these steps are not intentionally doped; therefore, an abnormal morphology and cracking are unlikely to occur during their growth, and the incidence of cracking during slicing is low as well.

Meanwhile, the GaN film 6 grown in the third step is provided with a portion that contains compensating impurities at concentrations of $1 \times 10^{17}$ atoms/cm$^3$ or higher; however, since the growth thickness of the GaN film 6 is 500 μm or less, an abnormal morphology and cracking are unlikely to occur during the growth. In addition, the GaN film 6 is not required to be sliced. In other words, it is not necessary to perform slicing in the above-described thinning step. Particularly, the GaN film 6 formed in the third step is preferably put through the thinning step without being sliced.

Moreover, in the GaN substrate wafer obtained by the above-described production method, a variation in the off-cut orientation within the main surfaces can be extremely small.

The reason for this is because the warpage of the second thick GaN film 4, which is homoepitaxially grown without being intentionally doped on the first c-plane GaN wafer 3 that is not intentionally doped, can be extremely small and, therefore, a variation in the off-cut orientation can be extremely small in the second c-plane GaN wafer 5 sliced from the second thick GaN film 4.

An example of an HVPE apparatus that can be used in the first to the third steps included in the above-described production method will now be described referring to FIG. 8.

Figure 8:
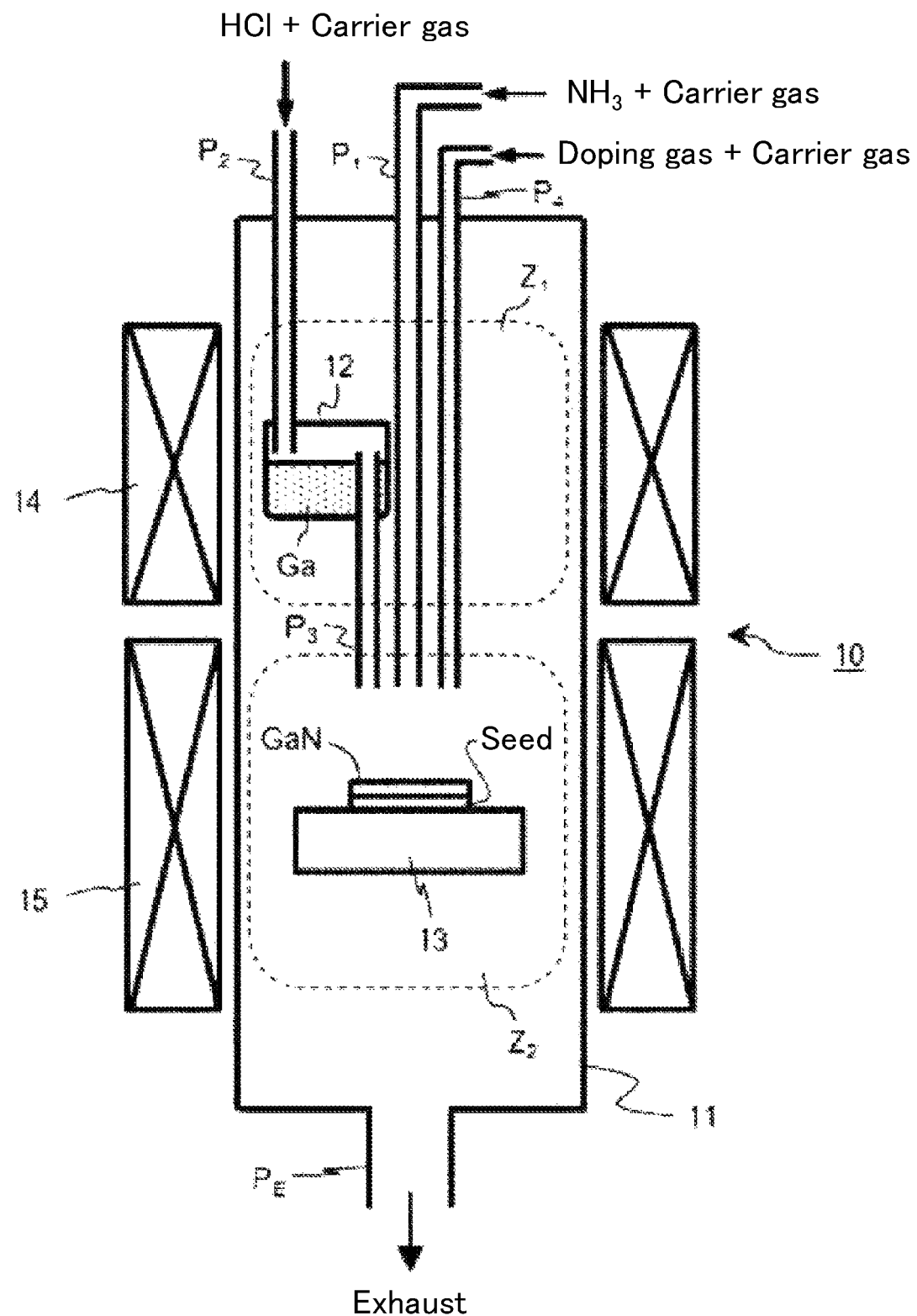
FIG. 8 is a schematic drawing that illustrates a basic configuration of an HVPE apparatus.

An HVPE apparatus 10 illustrated in FIG. 8 includes: a hot wall-type reactor 11; a gallium reservoir 12 and a susceptor 13, which are arranged inside the reactor; and a first heater 14 and a second heater 15, which are arranged on the outside of the reactor. The first heater 14 and the second heater 15 each circularly surround the reactor 11.

The reactor 11 is a quartz tube chamber. Inside the reactor 11, there are a first zone $Z_1$ mainly heated by the first heater 14, and a second zone $Z_2$ mainly heated by the second heater 15. An exhaust pipe PE is connected to a reactor end on the side of the second zone $Z_2$.

The gallium reservoir 12 arranged in the first zone $Z_1$ is a quartz container having a gas inlet and a gas outlet.

The susceptor 13 arranged in the second zone $Z_2$ is formed of, for example, graphite. A mechanism for rotating the susceptor 13 may be arranged as desired.

In order to grow GaN using the HVPE apparatus 10, after placing a seed on the susceptor 13, the inside of the reactor 11 is heated by the first heater 14 and the second heater 15. At the same time, $NH_3$ (ammonia) diluted with a carrier gas is supplied to the second zone $Z_2$ through an ammonia introduction pipe $P_1$, and HCl (hydrogen chloride) diluted with a carrier gas is supplied to the gallium reservoir 12 through a hydrogen chloride introduction pipe $P_2$. This HCl reacts with gallium metal contained in the gallium reservoir 12, and the resulting GaCl (gallium chloride) is transferred to the second zone $Z_2$ through a gallium chloride introduction pipe $P_3$.

In the second zone $Z_2$, $NH_3$ and GaCl react with each other, and the resulting GaN is crystallized on the seed placed on the susceptor 13.

When intentionally doping the growing GaN, a doping gas diluted with a carrier gas is introduced to the second zone $Z_2$ inside the reactor 11 through a dopant introduction pipe $P_4$.

With regard to the ammonia introduction pipe $P_1$, the hydrogen chloride introduction pipe $P_2$, the gallium chloride introduction pipe $P_3$ and the dopant introduction pipe $P_4$, their portions arranged inside the reactor 11 are formed of quartz.

As the carrier gas used for diluting each of $NH_3$, HCl and the doping gas, $H_2$ (hydrogen gas), $N_2$ (nitrogen gas), or a mixed gas of $H_2$ and $N_2$ is preferably used.

Preferred conditions for growing GaN using the HVPE apparatus 10 are as follows.

The temperature of the gallium reservoir is, for example, 500 to 1,000° C., preferably 700° C. or higher, but preferably 900° C. or lower.

The temperature of the susceptor is, for example, 900 to 1,100° C., preferably 930° C. or higher, more preferably 950° C. or higher, but preferably 1,050° C. or lower, more preferably 1,020° C. or lower.

A V/III ratio which is a ratio between the $NH_3$ partial pressure and the GaCl partial pressure in the reactor is, for example, 1 to 20, preferably 2 or higher, more preferably 3 or higher, but preferably 10 or lower.

An excessively high or low V/III ratio causes deterioration of the growth surface morphology of GaN. Deterioration of the growth surface morphology can be a cause of a reduction in the crystal quality.

For a certain kind of impurity, the efficiency of incorporation into a GaN crystal is strongly dependent on the crystal orientation of the growth surface. The uniformity of the concentration of such an impurity is reduced inside a GaN crystal grown under a condition where the growth surface does not have good morphology. This is because facets of various orientations exist on the growth surface having poor morphology.

A typical example of an impurity that has a clearly different efficiency of incorporation into a GaN crystal depending on the crystal orientation of the growth surface is O (oxygen). Since O is a donor impurity, deterioration in the uniformity of its concentration leads to deterioration in the uniformity of the specific resistance.

In addition, an excessively low V/III ratio leads to an increase in the nitrogen vacancy concentration in the growing GaN crystal. The effects of nitrogen vacancies on a GaN crystal, a GaN substrate using the GaN crystal, or a nitride semiconductor device formed on the GaN substrate are not clear at present; however, since nitrogen vacancies are point defects, it is believed that the concentration thereof should be reduced as much as possible.

The growth rate of GaN is preferably 40 to 200 µm/h, and can be controlled using the product of the $NH_3$ partial pressure and the GaCl partial pressure in the reactor as a parameter. An excessively high growth rate leads to deterioration of the surface morphology of the growing GaN.

When the GaN film 6 is doped in the third step, in order to prevent deterioration of the growth surface morphology, it is preferred to gradually increase the supply rate of the doping gas to a prescribed value over a period of several minutes to several ten minutes from the start of the supply.

For the same reason, it is preferred to start the supply of the doping gas once the GaN film 6 has been grown to at least several micrometers.

A method of incorporating compensating impurities into the GaN film 6 is not particularly restricted, and a method of introducing a doping gas into the HVPE apparatus is usually employed.

As the doping gas for C doping, for example, a hydrocarbon gas such as $CH_4$ (methane) can be used.

As the doping gas for Fe doping, for example, vaporized iron chloride can be used. An iron chloride vapor can be generated by a method of bringing HCl into contact with heated metallic iron in a carrier gas stream, or a method of allowing ferrocene (bis(cyclopentadienyl) iron) heated and vaporized in a carrier gas stream to react with HCl in the dopant introduction pipe. It is noted here that ferrocene may be replaced with other iron-containing organic compound.

As the doping gas for Mn doping, for example, metallic Mn may be placed in the introduction pipe, and a gas generated by heating this metallic Mn can be used with a flow of a carrier gas or the like.

For an addition of other transition metal element to GaN, a vapor of the transition metal element or a vapor of chloride of the transition metal element can be used as the doping gas.

GaN grown by the HVPE apparatus 10, even when not intentionally doped, can contain O and Si at concentrations detectable by SIMS (secondary ion mass spectrometry). An Si source is quartz ($SiO_2$) used in the reactor and the pipes inside the reactor, and an O source is either or both of such quartz and water remaining inside or entering into the reactor.

Including those components omitted in FIG. 8, the components arranged inside the reactor 11 can be formed of, for example, SiC (silicon carbide), $SiN_x$ (silicon nitride), BN (boron nitride), alumina, W (tungsten) and Mo (molybdenum), in addition to quartz and carbon. This enables to control the concentration of each impurity excluding Si, O and H in GaN grown by the HVPE apparatus independently 10 to be $5\times10^{15}$ atoms/cm$^3$ or lower, unless GaN is intentionally doped.

EXAMPLES

The present invention will now be described more concretely by way of Examples thereof. The present invention, however, is not restricted to the below-described Examples, and various applications can be made without departing from the technical idea of the present invention.

Example

<Production of First c-Plane GaN Wafer (First Step)>

First, a GaN seed was set on a susceptor of an HVPE apparatus. A GaN template substrate on sapphire, which was prepared by MOCVD (metalorganic chemical vapor deposition), was used as the GaN seed, and the c-plane side thereof was used as a growth surface.

<Production of Second c-Plane GaN Wafer (Second Step)>

Next, while supplying $N_2$, $H_2$ and $NH_3$ into a reactor such that their partial pressures were 0.67 atm, 0.31 atm and 0.02 atm, respectively, the inside of the reactor was heated using heaters arranged on the outside of the reactor.

Once the susceptor temperature reached 1,000° C., the susceptor temperature was maintained constant so as to allow GaN to grow. The temperature of a gallium reservoir was set at 900° C. A carrier gas supplied into the reactor during the growth contained 69% by mole of $H_2$, and the remainder was $N_2$.

GaCl and $NH_3$ were supplied into the reactor such that their partial pressures were $7.9\times10^{-3}$ atm and 0.024 atm, respectively, whereby a second thick GaN film containing no donor impurity was grown to a thickness of about 2.5 mm. The growth rate of the second thick GaN film, which was calculated from the thickness and the growth time, was about 40 μm/h.

Subsequently, the thus obtained thick GaN film was sliced parallel to the c-plane to obtain a wafer, and the Ga-polar surface of this wafer was subjected to planarization by grinding and subsequent CMP finishing. Slice damages on the N-polar surface side of the wafer were removed by etching. Further, the wafer was cut to produce a 400 μm-thick second c-plane GaN wafer containing no donor impurity. The thus obtained wafer had a dislocation density of about $2\times10^6$ to $4\times10^6$ cm$^{-2}$.

It is noted here that two or more second c-plane GaN wafers can be obtained by extending the growth time and thereby increasing the thickness of the second thick GaN film.

<Production of GaN Substrate (Third Step)>

As a seed, the above-obtained second c-plane GaN wafer was set on a susceptor of an HVPE apparatus such that the c-plane side would be used as a growth surface.

Next, while supplying $N_2$ and $NH_3$ into a reactor such that their partial pressures were 0.84 atm and 0.16 atm, respectively, the inside of the reactor was heated using a heater arranged on the outside of the reactor.

Once the gallium reservoir temperature reached 900° C. and the susceptor temperature reached 1,030° C., the susceptor temperature was maintained constant and GaCl and $NH_3$ were supplied such that their partial pressures were 0.013 atm and 0.16 atm, respectively, whereby the growth of a GaN crystal was initiated. A carrier gas supplied during the growth consisted of only $N_2$.

Fe-doping was initiated one minute after the initiation of the growth by starting to supply $9.4\times10^{-4}$ atm of HCl into a dopant introduction pipe in which metallic Fe had been placed. A GaN film doped with Fe as a donor impurity was grown to a thickness of about 0.4 mm. The growth rate of the resulting Fe-doped GaN crystal layer was 1.6 μm/min.

The entire surface of this GaN film was observed under a differential interference contrast microscope to confirm that surface defects such as pits and cracks were not generated.

If a GaN film is grown to a thickness of about 0.8 mm under the same growth conditions as described above, pits may be generated on the resulting crystal surface due to the effect of irregular droppings and the like caused by deterioration of a constituent member of the apparatus. The crystal surface constituting the pits takes up donor impurities that exert electrical conductivity, such as oxygen and silicon, at high concentrations; therefore, there may be a problem that spots having different resistivity values are generated on the crystal surface. In addition, doping of the GaN film with compensating impurities at high concentrations tends to generate a stress in the GaN film, and this is pronounced as the growth thickness increases. The stress accumulated in the GaN film can lead to defects such as dislocations and cracks. In the present Example, it is believed that controlling the growth thickness of the GaN film (Fe-doped GaN crystal layer) to be about 0.4 mm had a good effect. When increasing the growth thickness, the above-described defects such as dislocations and cracks can be inhibited by lowering the doping concentrations of compensating impurities, and/or by taking measures of improving the apparatus, the production conditions, and the like.

The surface of the GaN film grown to a thickness of about 0.4 mm was finished by grinding and polishing the front surface (the side of the GaN film) and the back surface (the side of the second c-plane GaN wafer), respectively, without slicing, to produce an Fe-doped GaN substrate wafer having a thickness of 400 μm as a whole and a diameter of about 50 mm.

The thus obtained GaN substrate wafer was a double-layer substrate which had a 100 μm-thick first region (corresponding to the second c-plane GaN wafer) on the N-polar side and a 300 μm-thick second region (corresponding to the GaN film) on the Ga-polar side along with a regrowth interface.

When the impurity concentrations of the above-produced Fe-doped GaN substrate wafer were measured by SIMS, the concentrations of Fe, Si, O, and C were found to be $6.4\times10^{18}$ atoms/cm$^3$, $1.9\times10^{16}$ atoms/cm$^3$, $2.0\times10^{16}$ atoms/cm$^3$, and $7.1\times10^{15}$ atoms/cm$^3$, respectively.

Five spots were appropriately selected on the surface of the above-produced Fe-doped GaN substrate wafer, and the dislocation density at each spot was determined from the number of dark spots observed in a 100 μm×100 μm square area by cathodoluminescence imaging, as a result of which the dislocation density was found to be about $2\times10^6$ to $3\times10^6$ cm$^2$, which was equivalent to the dislocation density of the single-crystal GaN (0001) substrate used as the seed.

Evaluation of Resistivity by Double Ring Method

As a result of measuring the resistivity of the above-produced Fe-doped GaN substrate by a double ring method, the room-temperature resistivity was found to be $7\times10^{11}$ Ω·cm.

The present invention has been described based on concrete embodiments; however, these embodiments were presented as examples and should not limit the scope of the present invention. The embodiments described herein can each be variously modified without departing from the spirit of the present invention and, where feasible, may be combined with any feature described by another embodiment.

DESCRIPTION OF SYMBOLS

1: seed wafer
2: first thick GaN film
3: first c-plane GaN wafer
4: second thick GaN film
5: second c-plane GaN wafer
6: GaN film
6a: specific doped region
10: HVPE apparatus
11: reactor
12: gallium reservoir
13: susceptor
14: first heater
15: second heater
100: GaN substrate wafer
101: N-polar surface
102: Ga-polar surface
103: regrowth interface
110: first region
120: second region
120a: main doped region
200: epitaxial film
210: undoped GaN channel layer
220: undoped AlGaN carrier supply layer

The invention claimed is:

1. A (0001)-oriented GaN substrate wafer, comprising a first region arranged on an N-polar side and a second region, which is arranged on a Ga-polar side and has a minimum thickness, via a regrowth interface therebetween,
wherein
the minimum thickness of the second region is not less than 20 µm and is 200 µm or less, and
at least a portion of the second region has a total compensating impurity concentration of $1\times10^{17}$ atoms/cm$^3$ or higher.

2. The GaN substrate wafer according to claim 1, wherein the first region satisfies one or more conditions selected from the following (a) to (c):
(a) the Si concentration is $5\times10^{16}$ atoms/cm$^3$ or higher;
(b) the O concentration is $3\times10^{16}$ atoms/cm$^3$ or lower, and
(c) the H concentration is $1\times10^{17}$ atoms/cm$^3$ or lower.

3. The GaN substrate wafer according to claim 1, wherein, in the first region, a total compensating impurity concentration is lower than a total donor impurity concentration.

4. The GaN substrate wafer according to claim 1, wherein, in the first region, the total compensating impurity concentration is lower than $1\times10^{17}$ atoms/cm$^3$.

5. The GaN substrate wafer according to claim 1, wherein, in the first region, the concentrations of impurity elements other than Si, O, and H are independently $5\times10^{15}$ atoms/cm$^3$ or lower.

6. The GaN substrate wafer according to claim 1, satisfying one condition selected from the following (1) to (3):
(1) having a diameter of 50 mm to 55 mm and a thickness of 250 µm to 450 µm;
(2) having a diameter of 100 mm to 105 mm and a thickness of 350 µm to 750 µm; and
(3) having a diameter of 150 mm to 155 mm and a thickness of 450 µm to 800 µm.

7. The GaN substrate wafer according to claim 1, wherein the second region comprises a main doped region comprising at least a main surface of the Ga-polar side, and the main doped region has a total compensating impurity concentration of $1\times10^{17}$ atoms/cm$^3$ or higher.

8. The GaN substrate wafer according to claim 7, wherein, in the main doped region, the total compensating impurity concentration is twice or more of a total donor impurity concentration.

9. The GaN substrate wafer according to claim 7, wherein the main doped region comprises at least one element selected from carbon and transition metal elements.

10. The GaN substrate wafer according to claim 7, wherein an impurity contained in the main doped region at a highest concentration is Fe, Mn, or C.

11. The GaN substrate wafer according to claim 7, wherein
the main doped region is a region within a specific length from the main surface of a Ga-polar side, and
the specific length is not less than 20 µm.

12. The GaN substrate wafer according to claim 7, wherein, in the main doped region, a variation in the total compensating impurity concentration along a c-axis direction is in a range of ±25% from a median value.

13. The GaN substrate wafer according to claim 11, wherein the specific length is greater than 50 µm.

14. The GaN substrate wafer according to claim 11, wherein the specific length is 50% or more of the minimum thickness of the second region.

15. The GaN substrate wafer according to claim 1, wherein a main surface of the Ga-polar side is a flat surface.

16. The GaN substrate wafer according to claim 15, wherein the regrowth interface is inclined with respect to the main surface of the Ga-polar side.

17. An epitaxial wafer, comprising:
the GaN substrate wafer according to claim 1; and
a nitride semiconductor layer epitaxially grown on the main surface of the Ga-polar side of the GaN substrate wafer.

18. A method of producing an epitaxial wafer, the method comprising:
preparing the GaN substrate wafer according to claim 1; and
growing a nitride semiconductor layer on the main surface of the Ga-polar side of the GaN substrate wafer.

19. A method of producing a nitride semiconductor device, the method comprising:
preparing the GaN substrate wafer according to claim 1;
growing a nitride semiconductor layer on the main surface of the Ga-polar side of the GaN substrate wafer to obtain an epitaxial wafer; and
removing the first region of the GaN substrate wafer from at least a portion of the epitaxial wafer.

20. The GaN substrate wafer according to claim 1, wherein an overall thickness of the GaN substrate wafer is 250 µm to 800 µm.

21. The GaN substrate wafer according to claim 1, wherein the GaN substrate wafer has a disk shape, a diameter of about 2 inches, and an overall thickness of 300 µm to 450 µm.

22. The GaN substrate wafer according to claim 1, wherein the GaN substrate wafer has a disk shape, a diameter of about 4 inches, and an overall thickness of 350 µm to 650 µm.

23. The GaN substrate wafer according to claim 1, wherein the GaN substrate wafer has a disk shape, a diameter of about 6 inches, and an overall thickness of 450 µm to 700 µm.

24. A (0001)-oriented GaN substrate wafer, comprising a first region arranged on an N-polar side and a second region, which is arranged on a Ga-polar side and has a minimum thickness, via a regrowth interface therebetween,
wherein
the minimum thickness of the second region is not less than 20 µm and is 350 µm or less,
at least a portion of the second region has a total compensating impurity concentration of $1 \times 10^{17}$ atoms/cm$^3$ or higher, and
an overall thickness of the GaN substrate wafer is 250 µm to 800 µm.

\* \* \* \* \*